(12) United States Patent
Homer et al.

(10) Patent No.: US 8,712,717 B2
(45) Date of Patent: Apr. 29, 2014

(54) COMPUTER DEVICE WITH DIGITIZER CALIBRATION SYSTEM AND METHOD

(75) Inventors: Steven S. Homer, Tomball, TX (US);
James Scott Love, Houston, TX (US);
Pasha Mohi, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1592 days.

(21) Appl. No.: 11/241,536

(22) Filed: Sep. 30, 2005

(65) Prior Publication Data

US 2007/0075988 A1     Apr. 5, 2007

(51) Int. Cl.
*H04B 17/00* (2006.01)
*G06F 13/00* (2006.01)
*G01D 18/00* (2006.01)
*G01R 23/15* (2006.01)
*G06F 19/00* (2011.01)

(52) U.S. Cl.
CPC ............... *H04B 17/00* (2013.01); *G06F 13/00* (2013.01); *G01D 18/002* (2013.01); *G01R 23/15* (2013.01); *G06F 19/00* (2013.01)
USPC ............ 702/107; 324/76.39; 705/75; 705/88; 709/228; 710/62; 710/72

(58) Field of Classification Search
CPC .......... G01D 7/00; G01D 9/00; G01D 18/00;
G01D 18/002; G01D 18/004; G01D 18/006;
G01D 18/008; G01D 21/00; G01R 23/00;
G01R 23/02; G01R 23/15; G06F 11/00;
G06F 11/30; G06F 11/3051; G06F 11/32;
G06F 11/34; G06F 13/00; G06F 13/14;
G06F 13/38; G06F 17/00; G06F 17/40;
G06F 19/00; H04B 1/00; H04B 1/005; H04B
17/00; H04L 5/00; H04L 5/003; H04L 5/14;
H04L 7/00; H04L 2007/00
USPC ............... 73/76.11, 76.39, 1.01, 1.88, 432.1,
73/865.8, 865.9, 866.3; 702/1, 57, 75, 78,
702/85, 90, 91, 127, 189, 66, 88, 94, 95,
702/104, 106, 107, 187; 709/200, 220, 227,
709/228, 230; 710/16, 62, 67, 72, 73, 1, 15,
710/65; 713/1, 2, 100; 324/76.11, 76.39
See application file for complete search history.

(56) References Cited

U.S. PATENT DOCUMENTS

| | | | | | |
|---|---|---|---|---|---|
| 3,213,361 | A | * | 10/1965 | Dornberger et al. | 702/78 |
| 3,510,843 | A | * | 5/1970 | Bennett et al. | 710/16 |
| 3,990,007 | A | * | 11/1976 | Hohhof | 324/76.72 |
| 4,181,890 | A | * | 1/1980 | Yamamoto | 455/143 |
| 4,575,581 | A | | 3/1986 | Langberg | |
| 4,726,051 | A | * | 2/1988 | Schuermann | 379/68 |
| 4,745,565 | A | | 5/1988 | Garwin et al. | |
| 4,991,027 | A | * | 2/1991 | Enoki | 386/35 |

(Continued)

FOREIGN PATENT DOCUMENTS

JP     4-109187 A   *   4/1992
JP     6-311055 A   *  11/1994

*Primary Examiner* — Edward Cosimano

(57) ABSTRACT

A computer device comprises a calibration module adapted to detect an input frequency for at least one input mode of a digitizer device. The calibration module is configured to determine whether the input frequency is within a frequency tolerance band corresponding to the at least one input mode.

24 Claims, 2 Drawing Sheets

(56) References Cited

U.S. PATENT DOCUMENTS

| | | |
|---|---|---|
| 5,341,155 A | 8/1994 | Elrod et al. |
| 5,990,875 A | 11/1999 | Bi et al. |
| 6,005,200 A | 12/1999 | Stanchak et al. |
| 6,124,848 A | 9/2000 | Ballare et al. |
| 6,173,164 B1 * | 1/2001 | Shah .......................... 455/182.1 |
| 6,456,952 B1 | 9/2002 | Nathan |
| 2002/0084114 A1 | 7/2002 | Xu et al. |
| 2004/0214605 A1 * | 10/2004 | Zhang et al. ............... 455/562.1 |
| 2006/0270417 A1 * | 11/2006 | Chi ........................... 455/452.2 |
| 2007/0075988 A1 * | 4/2007 | Homer et al. .................. 345/179 |

\* cited by examiner

COMPUTER DEVICE WITH DIGITIZER CALIBRATION SYSTEM AND METHOD

BACKGROUND OF THE INVENTION

Digitizer devices, such as a computer pen or stylus, are used to provide input to computer devices such as notebook computers, tablet computers, and other types of digitizer-enabled computing devices. However, manufacturing tolerances, temperature conditions, and other variables can adversely affect the communications between the digitizer device and the computer device.

BRIEF DESCRIPTION OF THE DRAWINGS

For a more complete understanding of the present invention and the advantages thereof, reference is now made to the following descriptions taken in connection with the accompanying drawings in which.

DETAILED DESCRIPTION OF THE DRAWINGS

Figure 1:
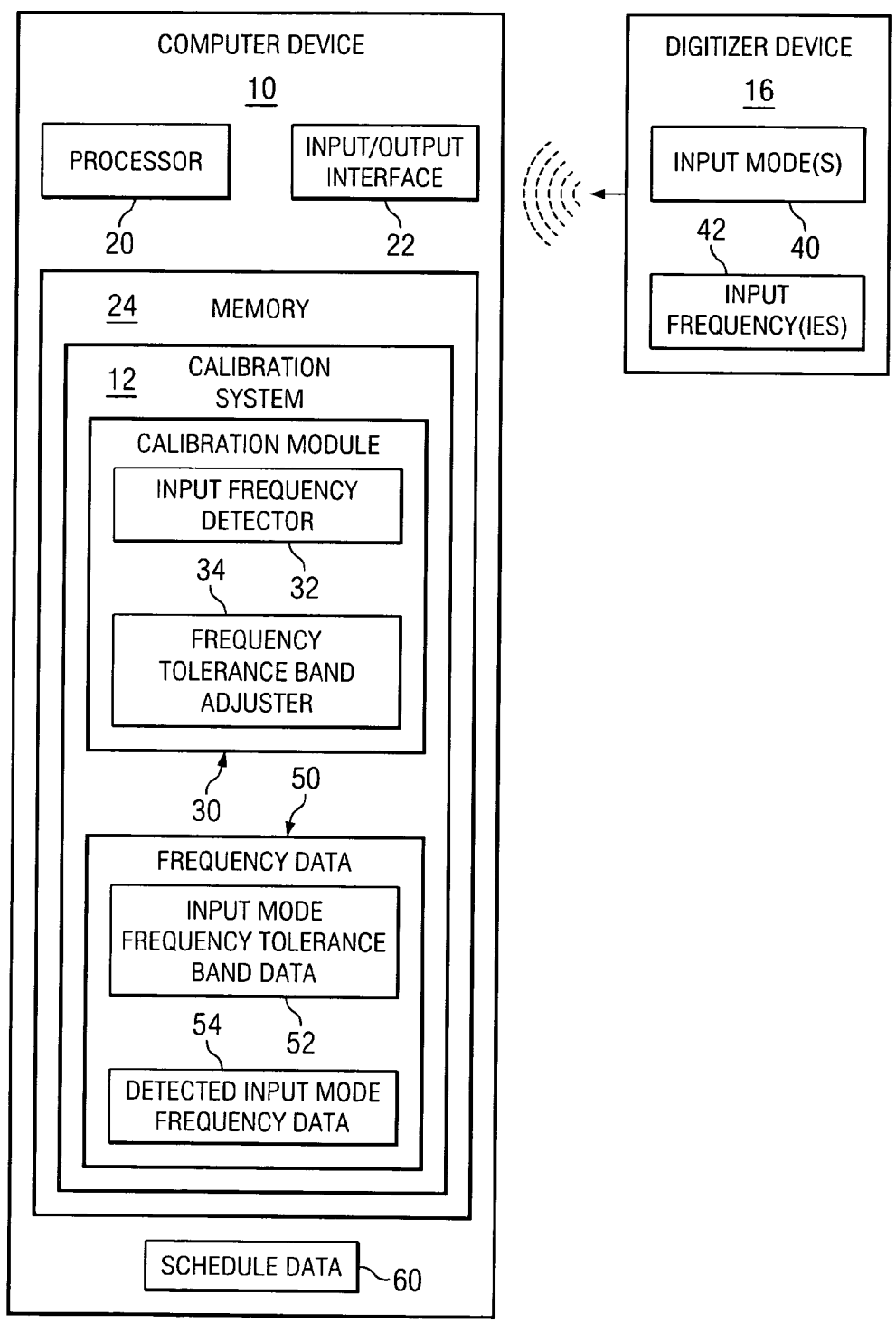
FIG. 1 is a diagram illustrating an embodiment of a computer device with digitizer calibration system in accordance with the present invention.
Figure 2:
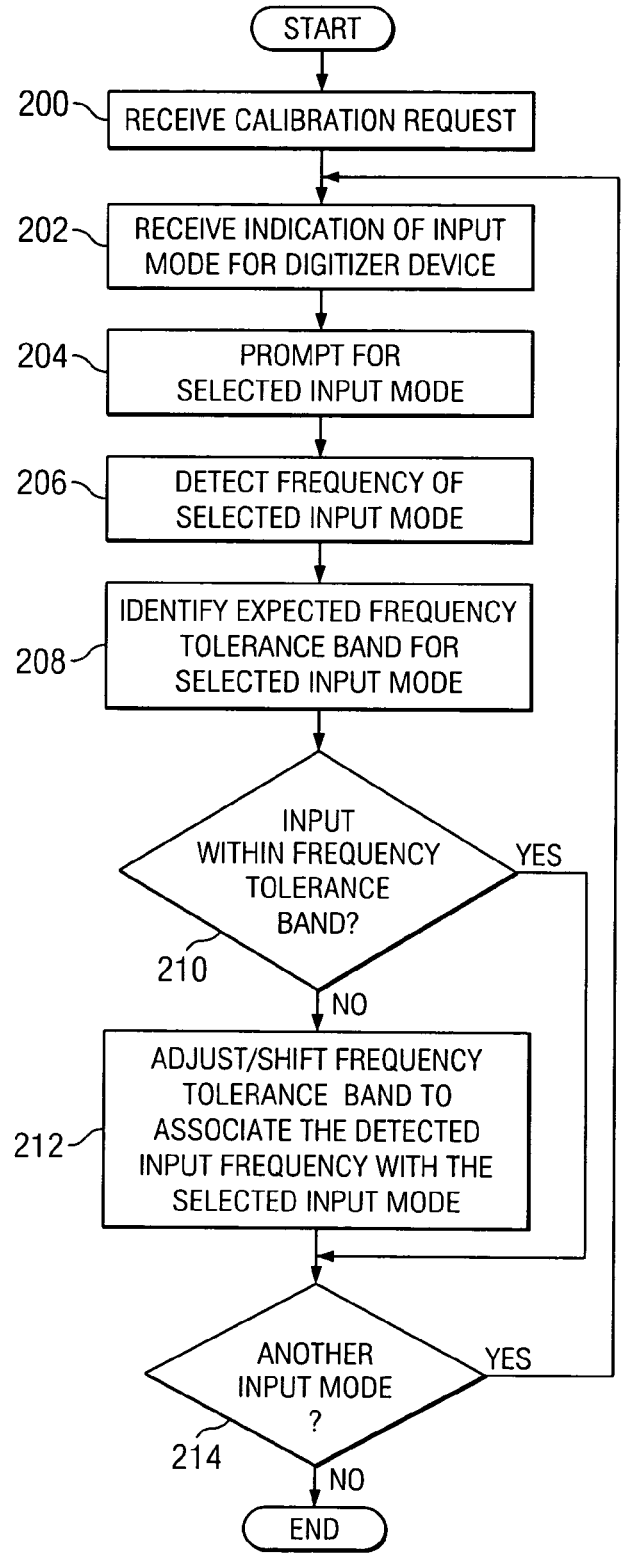
FIG. 2 is a flow diagram illustrating an embodiment of a method of digitizer calibration in accordance with the present invention.

The preferred embodiments of the present invention and the advantages thereof are best understood by referring to FIGS. 1 and 2 of the drawings, like numerals being used for like and corresponding parts of the various drawings.

FIG. 1 is a diagram an embodiment of a computer device 10 having a digitizer device calibration system 12 in accordance with the present invention. Computer device 10 may comprise any type of digitizer-enabled computer device such as, but not limited to, a laptop or notebook computer, tablet computer, or other type of computing device having a display and/or input surface for receiving an input from a digitizer device 16. Digitizer device 16 may comprise any type of device for providing a wireless input to computer device 10 such as, but not limited to, a computer pen or stylus.

In the embodiment illustrated in FIG. 1, computer device 10 comprises a processor 20, an input/output (I/O) interface 22, and a memory 24. I/O interface 22 may comprise any type of interface for receiving input from a user of computer device 10 and/or providing output of computer device 10 to the user such as, but not limited to, a keyboard, mouse, touchpad, display element, and a digitizer-enabled display and/or writing surface for receiving input from digitizer device 16. In the embodiment illustrated in FIG. 1, system 12 comprises hardware, software, or a combination of hardware and software. In the embodiment illustrated in FIG. 1, system 12 is illustrated as being stored in memory 24 so as to be accessible and/or executable by processor 20. However, it should be understood that system 12 may be otherwise stored and/or located. In the embodiment illustrated in FIG. 1, system 12 comprises a calibration module 30. In operation, calibration module 30 is used to calibrate computer device 10 to recognize and/or otherwise associate a particular type of actual input (e.g., a particular input frequency) of digitizer device 16 with a particular type of input mode (e.g., tip down mode, switch and/or button actuation mode, hover mode, slide mode, etc.).

In the embodiment illustrated in FIG. 1, calibration module 30 comprises an input frequency detector 32 and a frequency tolerance band adjuster 34. Input frequency detector 32 is configured to detect a frequency of an input received from digitizer device 16. For example, in some embodiments of the present invention, digitizer device 16 is configured to provide an input to computer device 10 by one or more different input modes 40 such as, but not limited to, tip down mode, switch and/or button actuation mode, hover mode, slide mode or any other type of mode for providing an input to computer device 10. Correspondingly, for each input mode 40, digitizer device 16 is configured to provide such input to computer device 10 at a particular input frequency 42 so that a computer device (e.g., computer device 10) can distinguish between the different types of input modes 40 of digitizer device 16. However, if a computer device does not recognize a particular input frequency and/or is otherwise unable to distinguish between different types of input modes 40, use of the digitizer device 16 is impaired. Accordingly, embodiments of the present invention calibrate computer device 16 to recognize and/or otherwise associate a particular input frequency of digitizer device 16 with a particular input mode 40.

In the embodiment illustrated in FIG. 1, memory 24 also comprises frequency data 50 having information associated with an expected input frequency range for various input modes 40 of digitizer device 16. For example, in the embodiment illustrated in FIG. 1, frequency data 50 comprises input mode frequency tolerance band data 52 and detected input mode frequency data 54. Input mode frequency tolerance band data 52 comprises information associated with a predetermined and/or an expected frequency range for a particular input mode 40 of digitizer device 16. For example, in some embodiments of the present invention, a frequency range for a tip down input mode 40 may be 482-494 KHz. Accordingly, it should be understood that for different input modes 40, different frequency tolerance bands are generally associated with and/or expected for different input modes 40 of digitizer device 16 (e.g., hover mode, switch mode, etc.). Detected input mode frequency data 54 comprises information associated with a detected frequency of an input received from digitizer device 16 for a particular input mode 40. For example, input frequency detector 32 may detect a signal frequency of 471 KHz for the tip down input mode 40 of digitizer 16. Accordingly, detected input mode frequency data 54 comprises frequency information detected by input frequency detector 32 associated with one or more input modes 40 actuated and/or input by digitizer device 16.

In operation, calibration module 30 is used to perform a calibration operation to calibrate computer device 10 to recognize and/or otherwise associate the various input frequencies 42 emitted and/or otherwise input by digitizer device 16 to particular input modes 40 of digitizer device 16. In some embodiments of the present invention, calibration module 30 receives an indication and/or designation of a particular input mode 40 to be actuated by digitizer device 16. For example, in some embodiments of the present invention, a user inputs to computer device 10 (e.g., via I/O interface 22 to calibration module 30) a particular type of input mode 40 available on digitizer device 16 (e.g., hover, tip down, slide, etc.). In some embodiments of the present invention, in response to receiving an indication of a particular model or manufacturer of digitizer device 16, calibration module 30 is configured to display a list of available input modes 40 for the particular digitizer device 16 for selection by a user. In some embodiments of the present invention, calibration module 30 is configured to display a listing of common and/or known types of input modes 40 for selection by the user. In yet other embodiments of the present invention, calibration module 30 is configured to receive an indication of a particular model or manufacturer of digitizer device 16 and automatically scroll and/or sequentially advance through each available type of input mode 40 for the indicated digitizer device 16. In yet other embodiments of the present invention, calibration module 30 is configured to detect a presence of a particular digitizer device 16 in close proximity to computer device 10 and, based on the particular digitizer device 16, list types of input modes 40 associated with the particular digitizer device 16 for selection by the user or, in the event that only a single input mode 40 is available for the particular digitizer device 16, automatically select the one type of input mode 40.

In response to receiving an indication of a particular input mode 40, calibration module 30 is configured to display a prompt and/or otherwise indicate to a user a request or readiness for the user to actuate digitizer device 16 in the indicated input mode 40. In response to actuation of the indicated input mode 40, input frequency detector 32 detects the input frequency 42 emitted by digitizer device 16 corresponding to the actuated input mode 40 and compares the detected input mode frequency 54 to an expected input mode frequency tolerance band 52 for the actuated input mode 40. If the detected input mode frequency 54 for the corresponding input mode 40 falls outside the expected input mode frequency tolerance band 52 associated with the actuated input mode 40 of digitizer device 16, frequency band tolerance adjuster 34 registers (i.e., recognizes and/or otherwise associates) the detected input mode frequency 54 as corresponding to the particular input mode 40. In some embodiments of the present invention, frequency band tolerance adjuster 34 adjusts and/or otherwise shifts a particular input mode frequency tolerance band 52 corresponding to the actuated input mode 40 such that the detected input mode frequency 54 falls within and/or is otherwise centered within the input mode frequency tolerance band 52 generally associated with the actuated input mode 40. Thus, for example, if the expected input mode frequency tolerance band 52 for a tip down input mode 40 is 482-494 KHz and the detected input mode frequency 54 of digitizer device 16 for the tip down input mode 40 is 477 KHz, calibration module 30 automatically adjusts the tolerance band 52 (e.g., expands, shrinks, shifts, moves, etc.) to capture the detected input mode frequency 54 (e.g., 477 KHz) within tolerance band 52. Thus, subsequent actuations of the particular input mode 40 by digitizer device 16 (e.g., 477 KHz+/−the tolerance indicated by tolerance band 52) are recognized by computer device 10 as corresponding to a tip down input mode 40 for the particular digitizer device 16. Preferably, frequency band tolerance adjuster 34 adjusts and/or otherwise shifts the input mode frequency tolerance band 52 associated with the tip down input mode 40 such that the detected input mode frequency 54 is centered within the tolerance frequency band 52. Thus, for the above example, frequency band adjuster 34 would shift the input mode frequency tolerance band 52 for the tip down input mode 40 from 482-494 KHz to 471-483 KHz. Preferably, calibration module 30 performs the calibration operation for each input mode 40 of digitizer device 16, thereby registering or otherwise associating each actual input frequency 42 emitted by digitizer device 16 to a corresponding type of input mode 40. However, it should be understood that calibration module 30 may also be used to calibrate device 10 for a single input mode 40.

In some embodiments of the present invention, calibration module 30 is configured to automatically perform a calibration operation of computer device 10 to digitizer device 16 according to a predetermined schedule. For example, in the embodiment illustrated in FIG. 1, memory 24 comprises schedule data 60 having information associated with a predetermined time interval and/or schedule for performing a calibration operation relative to digitizer device 16. However, it should be understood that computer device 10 may be configured to perform the calibration operation in response to a user input or request.

FIG. 2 is a flow diagram illustrating an embodiment of a digitizer device calibration method in accordance with the present invention. The method begins at block 200, where computer device 10 receives a calibration request. For example, in some embodiments of the present invention, computer device 10 is configured to perform a calibration operation of computer device 10 to digitizer device 16 based on a user input or request. However, as described above, it should be understood that calibration module 30 may be configured to automatically perform such calibration operation according to a predetermined schedule or otherwise. At block 202, calibration module 30 receives an indication of a particular input mode 40 corresponding to digitizer device 16 (e.g., one of tip down, switch activation, hover mode, or other type of input mode 40 of digitizer device 16). At block 204, calibration module 30 displays a prompt to the user requesting actuation of the inbdicated input mode 40 of digitizer device 16. For example, in some embodiments of the present invention, computer device 10 is configured to display and/or otherwise output a request to the user requesting actuation of the indicated input mode 40 of digitizer device 16.

At block 206, input frequency detector 32 detects the input frequency 54 emitted by digitizer device 16 for the indicated input mode 40. At block 208, calibration module 30 identifies the expected input mode frequency tolerance band 52 corresponding to the indicated input mode 40. At decisional block 210, a determination is made whether the detected input mode frequency 54 corresponding to the input mode 40 falls within the input mode frequency tolerance band 52 expected for the input mode 40. For example, in some embodiments of the present invention, calibration module 30 compares the detected input mode frequency 54 emitted by digitizer device 16 with a predetermined and/or expected input mode frequency tolerance band 52 generally associated with the indicated input mode 40. If the detected input mode frequency 54 is within the input mode frequency tolerance band 52, the method proceeds to decisional block 214. If the detected input mode frequency 54 falls outside the input mode frequency tolerance band 52, the method proceeds to block 212, where frequency tolerance band adjuster 34 the input mode frequency tolerance band 52 (e.g., shifts and/or otherwise adjusts) to capture the detected input frequency 54, thereby associating the detected input frequency 54 with the indicated input mode 40. At decisional block 214, a determination is made whether calibration is to be performed for another and/or different input mode 40 of digitizer device 16. If calibration is to be performed for another and/or different input mode 40 of digitizer device 16, the method proceeds to block 202. If no calibration of computer device 10 is needed and/or desired for another and/or different input mode 40 of digitizer device 16, the method ends.

Thus, embodiments of the present invention provide a digitizer calibration system 12 and method that accommodates changes in an emitted frequency of digitizer 16 for one or more input modes of the digitizer 16. Accordingly, embodiments of the present invention reduce and/or substantially eliminate digitizer-to-computer device compatibility and/or detection issues that may be otherwise caused by manufacturing tolerances, temperature variations, or other causes that may affect an emitted frequency of input signals of the digitizer device 16. Further, embodiments of the present invention accommodate the use of a variety of different types of digitizer devices 16 with computer device 10. For example, if a particular digitizer device 16 becomes misplaced, broken, a different user desires to use their own digitizer device, etc., a different digitizer device 16 may be used with computer 10 and calibration system 10 may be used to calibrate computer device 10 to the input frequencies 42 of the new/different digitizer device 16.

It should be understood that in the described method, certain functionality may be omitted, accomplished in a sequence different from that depicted in FIG. 2, or performed simultaneously or in combination. Also, it should be understood that the method depicted in FIG. 2 may be altered to encompass any of the other features or aspects of the invention as described elsewhere in the specification. Further, embodiments of the present invention may be implemented in software and can be adapted to run on different platforms and operating systems. In particular, functions implemented by calibration system 12, for example, may be provided as an ordered listing of executable instructions that can be embodied in any computer-readable medium for use by or in connection with an instruction execution system, apparatus, or device, such as a computer-based system, processor-containing system, or other system that can fetch the instructions from the instruction execution system, apparatus, or device, and execute the instructions. In the context of this document, a "computer-readable medium" can be any means that can contain, store, and communicate the program for use by or in connection with the instruction execution system, apparatus, or device. The computer-readable medium can be, for example, but is not limited to, an electronic, magnetic, optical, or electromagnetic medium, or semi-conductor system, apparatus, or device.

What is claimed is:

1. A computer system, comprising:
   at least one processor; and
   a calibration module comprising stored instructions executable by the at least one processor to:
      receive an indication of an input mode of a digitizer device that corresponds to a manner of providing input from the digitizer device to the computer system;
      detect a frequency of an input signal from the digitizer device in the input mode;
      determine whether the frequency of the input signal falls outside a frequency tolerance band corresponding to the input mode, the frequency tolerance band defining a band of frequencies in which an input is expected for the input mode; and
      in response to determining that the frequency of the input signal falls outside the frequency tolerance band, adjust the frequency tolerance band to include the frequency of the input signal.

2. The computer system of claim 1, wherein the calibration module is executable to cause display, on a display device connected to the computer system, a prompt requesting actuation of the digitizer device in the input mode.

3. The computer system of claim 1, wherein adjusting the frequency tolerance band comprises shifting the frequency tolerance band to center the frequency of the input signal within the frequency tolerance band.

4. The computer system of claim 1, wherein the calibration module is executable to initiate calibration of the computer system to the digitizer device pursuant to a predetermined schedule.

5. The computer system of claim 1, wherein the calibration module is executable to initiate calibration of the computer system to the digitizer device in response to a user input.

6. A digitizer calibration method, comprising:
   receiving, by a computer device, an indication of an input mode of a digitizer device that corresponds to a manner of providing input from the digitizer device to the computer system;
   detecting, by the computer device, a frequency of an input signal from the digitizer device in the input mode;
   determining, by the computer device, whether the frequency of the input signal falls outside a frequency tolerance band corresponding to the input mode, the frequency tolerance band defining a band of frequencies in which an input is expected for the input mode; and
   in response to determining that the frequency of the input signal falls outside the frequency tolerance band, modifying, by the computer device, the frequency tolerance band to include the frequency of the input signal.

7. The method of claim 6, further comprising displaying a prompt requesting actuation of the digitizer device in the input mode.

8. The method of claim 6, further comprising automatically initiating calibration of the computer device to the digitizer device pursuant to a predetermined schedule.

9. The method of claim 6, further comprising initiating calibration of the computer device to the digitizer device in response to a user input.

10. The method of claim 7, further comprising displaying a prompt requesting actuation of a different input mode of the digitizer device.

11. A computer device, comprising:
    an interface for communicating to a digitizer device;
    at least one processor; and
    a calibration module comprising stored instructions executable by the at least one processor to:
       receive an indication of a selected one of a plurality of different input modes of the digitizer device that correspond to different manners of providing input from the digitizer device to the computer device, wherein the different input modes correspond to respective different frequency tolerance bands, each of the frequency tolerance bands defining a band of frequencies in which an input is expected for the corresponding one of the input modes;
       detect a frequency of an input signal from the digitizer device in the selected input mode;
       determine whether the frequency of the input signal is within the frequency tolerance band corresponding to the selected input mode; and
       in response to the determining, adjust the frequency tolerance band corresponding to the selected input mode to include the frequency of the input signal.

12. The computer device of claim 11, wherein the calibration module is executable to cause display, on a display device of the computer device, a prompt requesting actuation of the digitizer device in the input mode.

13. The computer device of claim 11, wherein the calibration module is executable to request actuation of a different input mode of the digitizer device.

14. The computer device of claim 11, wherein the adjusting comprises centering the frequency of the input signal within the frequency tolerance band.

15. The computer device of claim 11, wherein the calibration module is executable to initiate calibration of the computer device to the digitizer device pursuant to a predetermined schedule.

16. The computer device of claim 11, wherein the calibration module is executable to initiate calibration of the computer device to the digitizer device in response to a user input.

17. The computer device of claim 11, wherein the at least one processor is configured to further:
   receive a further input signal having a given frequency from the digitizer device; and
      identify an input mode from among the different input modes of the digitizer device based on which of the different frequency tolerance bands the given frequency falls into.

18. The computer device of claim 11, wherein the calibration module is executable to perform a calibration operation including the receiving, the detecting, the determining, and the adjusting, in response to a calibration request.

19. The computer device of claim 18, wherein the calibration module is executable to, in response to the calibration request, display a prompt in a display device of the different input modes, and wherein the received indication of the selected input mode is responsive to user selection of one of the different input modes in the displayed prompt.

20. The computer device of claim 19, wherein the calibration module is executable to:
   identify a type of the digitizer device; and
   determine types of input modes for the identified type of the digitizer device, wherein the different input modes in the displayed prompt correspond to the determined types of input modes.

21. A non-transitory computer-readable medium having stored thereon an instruction set to be executed, the instruction set, when executed by a computer device, causes the computer device to:
   receive an indication of a selected one of a plurality of different input modes of the digitizer device that correspond to different manners of providing input from the digitizer device to the computer device, wherein the different input modes correspond to respective different frequency tolerance bands, each of the frequency tolerance bands defining a band of frequencies in which an input is expected for the corresponding one of the input modes;
   detect a frequency of an input signal from the digitizer device in the selected input mode;
   determine whether the frequency of the input signal is within the frequency tolerance band corresponding to the selected input mode; and
   in response to the determining, adjust the frequency tolerance band corresponding to the selected input mode to include the frequency of the input signal.

22. The computer-readable medium of claim 21, wherein the adjusting comprises centering the frequency of the input signal within the frequency tolerance band corresponding to the selected input mode.

23. The computer-readable medium of claim 21, wherein the instruction set, when executed by the computer device, causes the computer device to calibrate the computer device to recognize signals from the digitizer device based at least in part on the adjusted frequency tolerance band.

24. The computer-readable medium of claim 21, wherein the instruction set, when executed by the computer device, causes the computer device to initiate calibration of the computer device to the digitizer device in response to a user input or to a predetermined schedule.

* * * * *